Feb. 14, 1967 J. E. SHEAHAN ET AL 3,304,443
DELAY CIRCUIT
Filed Feb. 12, 1965

NOTE
Vce(sat) of 10 > Vce(sat) of 11

INVENTORS
JAMES E. SHEAHAN
EDWIN H. PAUL JR.
BY, Alfred H. [signature]
Thomas N. [signature]
ATTORNEYS

United States Patent Office 3,304,443

Patented Feb. 14, 1967

3,304,443

DELAY CIRCUIT

James E. Sheahan, Framingham, and Edwin H. Paul, Jr., Natick, Mass., assignors, by mesne assignments, to Honeywell Inc., a corporation of Delaware Filed Feb. 12, 1965, Ser. No. 432,351
11 Claims. (Cl. 307—88.5)

The present invention is directed to a simple transistor delay circuit which operates equally well with the input pulse longer or shorter than the delay interval.

One of the simplest forms of delay circuits as illustrated in FIG. 1 uses two transistors, 10 and 11 connected with direct coupled emitters and collectors and a third transistor 14 cross-coupled with transistors 10 and 11. The delay is determined by RC network 12 coupling the collectors 13 of transistors 10 and 11 to the base 15 of transistor 14 and the cross-coupling is completed by resistive feedback connection 16 from collector 17 of the transistor 14 to base 18 of transistor 11. Base 20 of transistor 10 is the input. Collectors 13 and 17 and base 15 are all resistively connected to one side 21 of a voltage supply. The emitters of the transistors are all connected to the other side of the supply designated ground.

With input 20 at ground, transistors 10 and 11 are off allowing collectors 13 to rise to $V_{cc}$ (supply voltage). Transistor 14 saturates holding collector 17 at approximately plus 0.3 volt. Base 15 is approximately plus 0.6 volt due to the clamping action of the base-emitter diode.

An input signal greater than plus 0.6 volt will turn on transistor 10 and cause it to saturate. Collectors 13 will swing negative by $V_{cc}$ minus $V_{ce}$ of transistor 10 in saturation. This transition will couple through RC network 12 to base 15 causing transistor 14 to turn off. Collector 17 will rise then transistor 11 will saturate and hold collectors 13 at plus 0.3 volt. After this regenerative action has taken place the input may return to zero volts.

Base 15 will begin to rise toward $V_{cc}$ on an exponential curve determined by RC network 12. As this point becomes positive (at time $T_1$) transistor 14 will begin to conduct. Collector 17 will fall at a rate determined by the rate of change of base 15 voltage and the gain-bandwidth product of transistor 14. Eventually, (at time $T_2$) collector 17 will fall sufficiently negative to turn off transistor 11. With the input at zero volts, collectors 13 will rise toward $V_{cc}$ and couple a positive transition to base 15. This regenerative action will turn transistor 14 on rapidly and result in a well defined edge at collector 17. The circuit is now in its D.C. stable state. The voltage changes described above are illustrated graphically in FIG. 2. The numbers in parenthesis represent the electrodes in FIG. 1 at which the waveforms are found.

In the first example the input pulse width was less than the output pulse width. FIG. 3 shows a waveform sequence which occurs when the input pulse width is greater than the output pulse width.

The waveforms are similar to those of FIG. 2 until time $T_1$ when transistor 14 begins to conduct. Collector 17 begins to go negative, again dependent upon the rate of change of base 15 and the gain-bandwidth of transistor 14. Again, transistor 11 will turn off near time $T_2$ but transistor 10 (being still saturated) will prevent collectors 13 from rising and causing regeneration. Transistor 14 will eventually saturate.

When operation as depicted in FIG. 3 occurs, the delay will be dependent only upon the rate of change of base 15 voltage and the gain-bandwidth of transistor 14. The loss of positive regeneration path, which was present in the mode of operation depicted in FIG. 2, is a very undesirable feature.

Now in accordance with the present invention it has been found that a simple modification of the above delay circuit enables a sharp output response irrespective of the characteristics of transistor 14 with an input pulse width longer than that of the output pulse. This is accomplished by increasing the saturation voltage drop across transistor 10 relative to transistor 11. Thus it is an object of the present invention to define a transistor delay circuit having improved characteristics in response to an extended input pulse.

Further objects and features of the invention will be understood upon reading the following description together with drawings in which.

Figure 1:
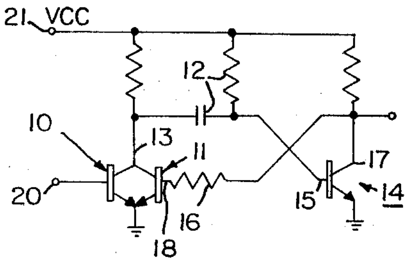
FIGS. 1, 2 and 3 represent prior art.
Figure 3:
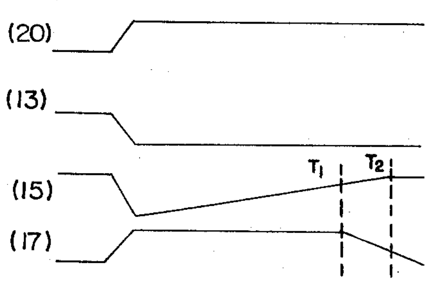
Figure 4:
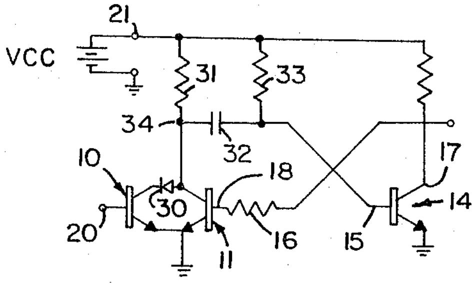
FIG. 4 is a delay circuit in accordance with the invention.

FIG. 4 shows a version of FIG. 1 modified in accordance with the invention. Diode 30 has been added in series with one electrode connected to the collector of transistor 10 and the other electrode connected jointly with the collector of transistor 11 to load resistor 31 at junction point 34. This diode eliminates the undesirable fall time shown in the bottom waveform of FIG. 3.

When an input is applied to transistor 10, it will saturate and pull junction point 34 down to approximately 0.9 volt (the saturation voltage drop across transistor 10 plus the forward voltage drop across diode 30). This transition is again coupled through capacitor 32 to base 15 turning transistor 14 off. Collector 17 will rise and turn transistor 11 on causing it to saturate. Since the saturation voltage of transistor 11 is approximately plus 0.3 volt, diode 30 will back bias and transistor 10 will no longer influence the voltage at the junction of diode 30 and resistor 31.

Figure 5:
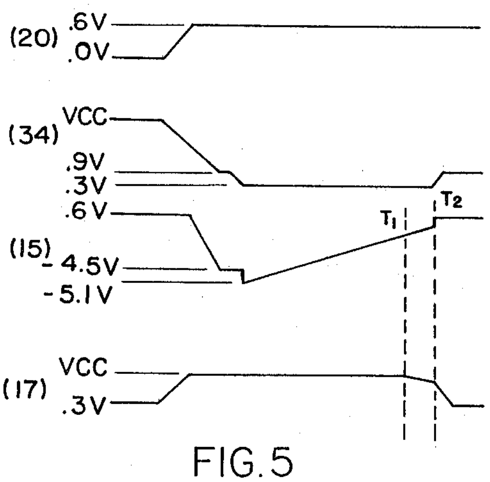
FIG. 5 is a graphical representation of the voltage variations at different points in the circuit of FIG. 4 when an extended input pulse is applied.

At time $T_1$ (see FIG. 5), transistor 14 will conduct and pull collector 17 negative until transistor 11 has turned off. At time $T_2$, junction point 34 will rise to its original level of plus 0.9 volt and be clamped by transistor 10. This positive transition causes rapid turn-on of transistor 14 and fast regeneration. Collector 17 will now fall sharply as illustrated in FIG. 5.

The embodiment of FIG. 4 shows a diode added in the collector circuit of transistor 10 to increase the saturated voltage drop across that part of the circuit. However, this result can be obtained in various other ways.

Figure 6:
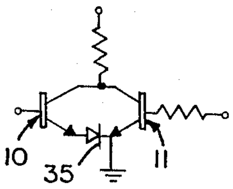
Figure 9:
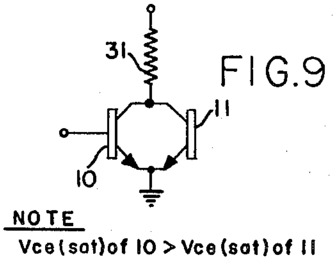

FIG. 6 shows a diode 35 added in the emitter circuit of transistor 10 to accomplish the same purpose as diode 30 in FIG. 4. Instead of adding a separate diode, transistor 10 can be replaced with a four layer semiconductor in which the diode is integral with the transistor. The two transistors 10 and 11 can also be selected so that transistor 10 has a higher saturated voltage drop than transistor 11. This is indicated in FIG. 9.

Figure 8:
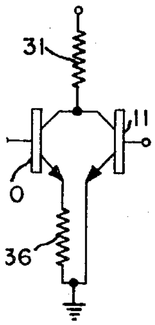
FIG. 8 PRIOR ART
FIGS. 6 to 9 show variations of FIG. 4 within the scope of the invention.
Figure 7:
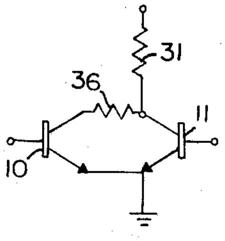
Figure 2:
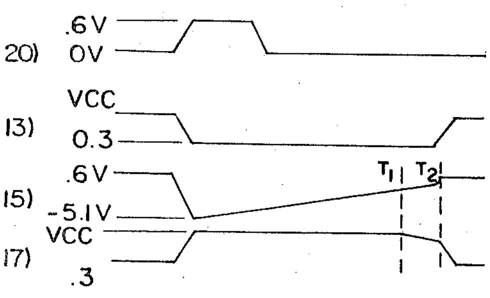

FIG. 7 shows still a further variation in which the additional voltage drop in the transistor 10 circuit is obtained by adding resistor 36 between the collector of transistor 10 and load resistor 31. As in the case of diode 35, and as illustrated in FIG. 8, this resistor can also be effectively placed in the emitter circuit of transistor 10.

Those skilled in the art will recognize that in order to keep the input response characteristics as close as possible to the circuit of FIG. 1, the additional voltage dropping element is preferably added in the collector circuit of transistor 10. Adding an element in the emitter circuit will increase the required turn-on voltage for the transistor. This can be an advantage where noise is a problem and ample input signal is available.

While the present invention has been described in accordance with specific embodiments thereof, a number of variations within the scope of the invention will be apparent to those skilled in the art and it is intended that the invention be covered broadly within the spirit and scope of the appended claims.

What is claimed is:

1. A transistor delay circuit comprising a first transistor, a second transistor and a third transistor each having base, collector, and emitter electrodes, supply and ground terminals for connecting said circuit across a voltage source, a connection between each emitter electrode and said ground terminal, means to connect the collector electrodes of said first transistor and said second transistor to a first point, a resistive connection between said point and said supply terminal, a resistor-capacitor time constant network connected between said point and the base electrode of said third transistor, a resistive connection between said supply terminal and the collector electrode of said third transistor, a resistive connection between the collector electrode of said third transistor and the base electrode of said second transistor, means to connect an external signal to the base electrode of said first transistor, and a voltage dropping element connected in series with the collector-emitter circuit of said first transistor between said print and said ground terminal to the exclusion of and separately from the collector-emitter circuit of said second transistor.

2. A transistor delay circuit according to claim 1 in which said dropping element is a diode directly connected between the collector of said first transistor and said point.

3. A transistor delay circuit according to claim 1 in which said dropping element is a diode directly connected between the emitter electrode of said first transistor and said ground terminal.

4. A transistor delay circuit according to claim 1 in which said dropping element is a resistor directly connected between the collector electrode of said first transistor and said point.

5. A transistor delay circuit according to claim 1 in which said dropping element is a resistor directly connected between the emitter electrode of said first transistor and said ground terminal.

6. In a transistor delay circuit comprising a first transistor having base, collector and emitter electrodes, and a second transistor having base, collector and emitter electrodes, connected in a face-to-face arrangement with the collector electrodes of the two transistors connected to a first point and the emitter electrodes of the two transistors connected to a second point, a third transistor connected by a resistor-capacitor time constant network to said first point, a feedback circuit between said third transistor and said base electrode of said second transistor, means to connect an external signal to said base of said first transistor, and means to connect a voltage source across said first point and said second point, the combination in said face-to-face arrangement comprising a voltage dropping element connected in series with said first transistor between said first point and said second point, a direct connection between the collector electrode of said second transistor and said first point and a direct connection between the emitter electrode of said second transistor and said second point.

7. A transistor delay circuit according to claim 6 in which said dropping element is a diode directly connected between the collector electrode of said first transistor and said first point.

8. A transistor delay circuit according to claim 6 in which said dropping element is a diode directly connected between the emitter electrode of said first transistor and said second point.

9. A transistor delay circuit according to claim 6 in which said dropping element is a resistor directly connected between the collector electrode of said first transistor and said first point.

10. A transistor delay circuit according to claim 6 in which said dropping element is a resistor directly connected between the emitter electrode of said first transistor and said second point.

11. A transistor delay circuit according to claim 6 in which said dropping element is an integral part of said first transistor.

References Cited by the Examiner

UNITED STATES PATENTS 3,153,781 10/1964 Quiogue ---------- 307—88.5

ARTHUR GAUSS, *Primary Examiner.*

J. ZAZWORSKY, *Assistant Examiner.*